United States Patent [19]

Harris

[11] Patent Number: 5,714,886
[45] Date of Patent: Feb. 3, 1998

[54] METHOD OF CALIBRATING THE TRIP POINT OF AN OVERLOAD RELAY

[75] Inventor: Matthew B. Harris, Raleigh, N.C.

[73] Assignee: Square D Company, Palatine, Ill.

[21] Appl. No.: 773,382

[22] Filed: Dec. 26, 1996

[51] Int. Cl.[6] .................................................. G01R 35/00
[52] U.S. Cl. ........................................................ 324/601
[58] Field of Search .............................. 73/1 R; 324/601; 29/407.05; 361/87; 335/132

[56] References Cited

U.S. PATENT DOCUMENTS 4,764,744  8/1988  Alley et al. .
5,565,785  10/1996  Rodgers et al. ..................... 324/601

*Primary Examiner*—Robert Raevis
*Attorney, Agent, or Firm*—David Russell Stacey; Larry T. Shrout; Larry I. Golden

[57] ABSTRACT

A method of calibrating the selectable trip points of an overload relay wherein a neural network is used in the calibration process. The calibration method involves precisely positioning an indicia comprised of a number of graduation marks or symbols each representing a particular trip point and having a range and spacing unique to the characteristics of an overload detection circuit of a particular overload relay. The indicia is calibrated with respect to predetermined positions of a trip point indicator and fixed with respect to the predetermined positions of the trip point indicator. The range and spacing of the indicia graduations is derived from the neural networks learned trip point values and from trip point values obtained from the particular overload relay being calibrated.

1 Claim, 7 Drawing Sheets

METHOD OF CALIBRATING THE TRIP POINT OF AN OVERLOAD RELAY

FIELD OF THE INVENTION

The present invention relates to the field of electronic overload relays and particularly to a method for calibrating user selectable tripping points.

BACKGROUND OF THE INVENTION

It is common in the field of electronic overload relays to have user selectable overload current trip points which may be varied over a particular range of overload currents preselected by the manufacturer. The trip point of the overload relay is selected by moving a pointer from one position on a scale to another position on the scale, where the scale indicates a number of discrete overload current values at which the overload relay will initiate a trip. The pointer is connected to a variable resistor in the overload sensing circuit such that as the pointer is moved from one position to another along the scale the resistance of the variable resistor changes. Changing the resistance of the variable resistor changes the characteristics of the overload sensing circuit and thus changes the overload current value at which the relay initiates a trip. Although the electrical components of the sensing circuit are manufactured to industry standards, the components in combination can effect the percent of error of the overload sensing circuit. The two most critical elements in the overload sensing circuit are the current transformers through which a current proportional to that flowing in the protected circuit is induced and the variable resistor which changes circuit characteristics such that the relay will initiate a trip at the selected overload current. It has been common practice to calibrate the overload sensing circuit by adding a trimmer resistor to the variable resistor. The trimmer resistor will provide some linear correction to the variable resistor but has no effect on the more significant error caused by the current transformers. This calibration method requires access to the trimmer resistor after the device is fully assembled or at least after the overload indicator scale is in its final relationship with the pointer of the trip point indicator. Since the trimmer resistor is generally adjusted by a person there is also a chance of human error being added to the overload sensing circuit. This method of calibration adds both material and labor cost to the overload relay. It is therefore desirable to provide a fast, accurate and inexpensive method of calibrating the overload sensing circuit as a whole, including the current transformers and the variable resistor, without adding any additional electrical components to the circuit or requiring access to components after assembly has been completed. It would also be desirable for the overload sensing circuit calibration method to be automated such that any possible human error is eliminated from the circuit calibration.

SUMMARY OF THE INVENTION

The present invention discloses a method of calibrating the entire overload sensing circuit of each overload relay individually and without the possibility of operator induced error. The calibration method of the present invention does not require any additional electronic components, assembly labor or access to operator adjustable internal electrical components after assembly is completed. The calibration method of the present invention is similar to the potentiometer and circuit calibration method disclosed in U.S. Pat. No. 5,565,785, issued on Oct. 15, 1996, assigned to the present assignee and incorporated herein by reference. The calibration method of the present invention employs a neural network program which is trained by learning the precise position of a trip point indicator with respect to a known position for a number of preselected trip points (overload currents) of a training set comprising a statistically significant number of overload relays.

The neural network is trained for low error by learning three particular positions of the trip point indicator at which threshold currents will be measured.

The trained neural network is then validated by checking the learned characteristics of the training set against another set of overload relays, the validation set. Using the previously learned information and the threshold currents from the three particular positions of the trip point indicator of an individual overload relay the neural network will then produce an output in the form of instructions to a marking device which will produce indicia representing all of the preselected trip points for that particular individual overload relay. Each indicia is precisely positioned adjacent the trip point indicator by a marking machine, such as a laser marker, thereby calibrating the indicia to the trip point indicator for a particular overload relay such that each of the indicia associated with each of the preselected trip points for that particular overload relay is within a low percent of error. The positioning of the trip point indicator during training, validation of the neural network and actual calibration of an overload rely is performed by a computer controlled trip point indicator operator such as a robotic arm. Thereby, eliminating the possibility of human error from the calibration process. There are no additional electronic components or adjustments required in this calibration method.

Other features and advantages of the invention will become apparent to those skilled in the art upon review of the following detailed description, claims and drawings.

Figure 1:
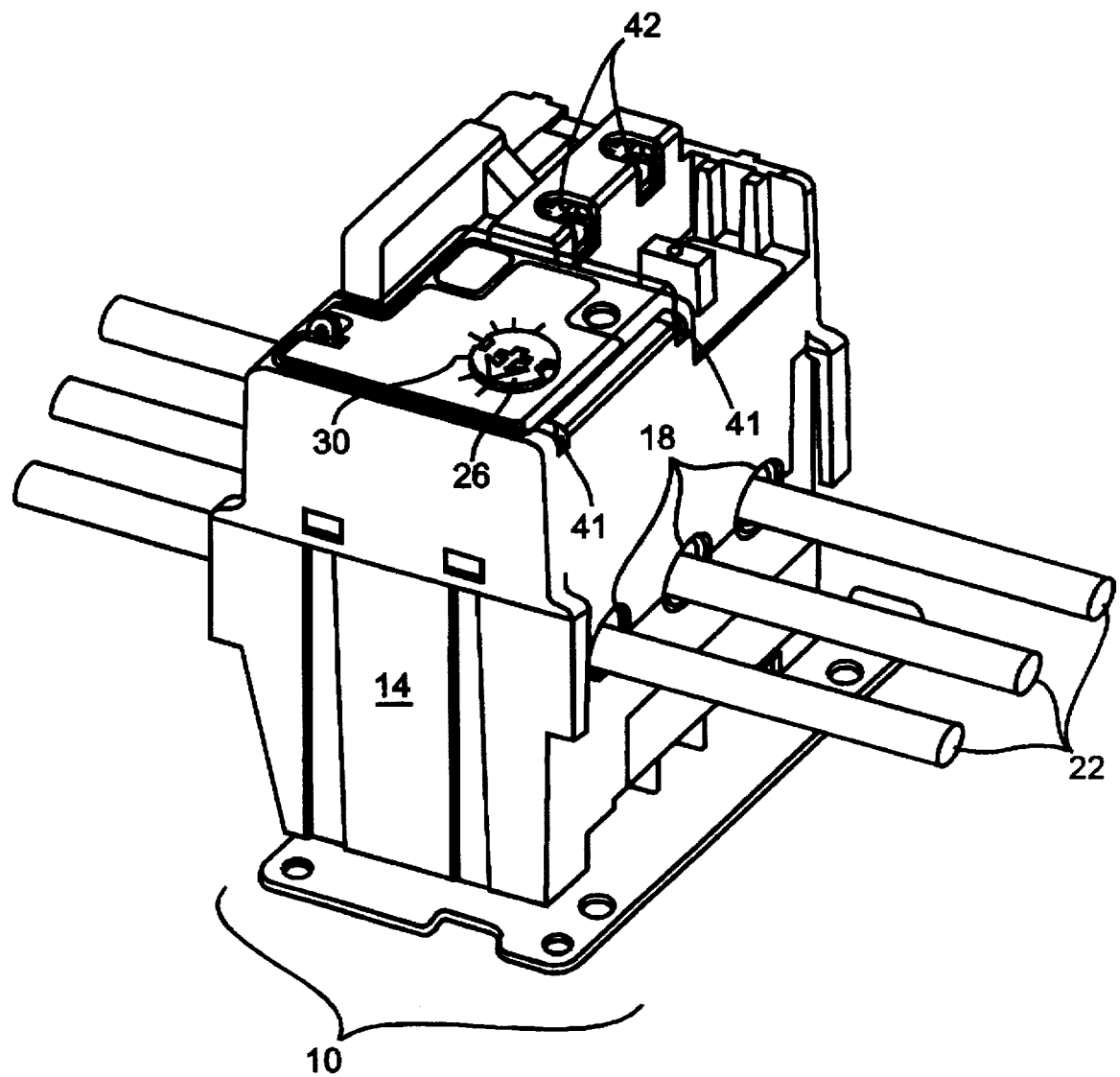
FIG. 1 is an isometric view of an overload relay having a user selectable overload trip point.

Before one embodiment of the invention is explained in detail, it is to be understood that the invention is not limited in its application to the details of construction and description or illustrated in the drawings. The invention is capable of other embodiments and of being practiced or being carried out in various other ways. Also, it is to be understood that the phraseology and terminology used herein is for the purpose of description and should not be regarded as limiting.

DESCRIPTION OF THE PREFERRED EMBODIMENT

FIG. 1 illustrates the an overload relay having user selectable trip points in accordance with the present invention and generally indicated by reference numeral 10. The electrical components of the overload relay 10 are enclosed in a housing 14 which includes passages 18 for receiving electrical conductors 22 of a primary circuit (the protected circuit). Located on the outside of the housing 14 is a trip point indicator 26 which permits the user to select an overload trip point within a predetermined range of overload currents provided by the manufacturer of the overload relay 10. An indicia 30 immediately adjacent the trip point indicator 26 indicates the manufacturers preselected overload current range and a number of preselected overload current values or trip points within that range at which the overload relay 10 will initiate a trip signal. The user selects a desired trip point by moving the trip point indicator 26 such that it points to the indicia 30 representing the desired trip point.

Figure 2:
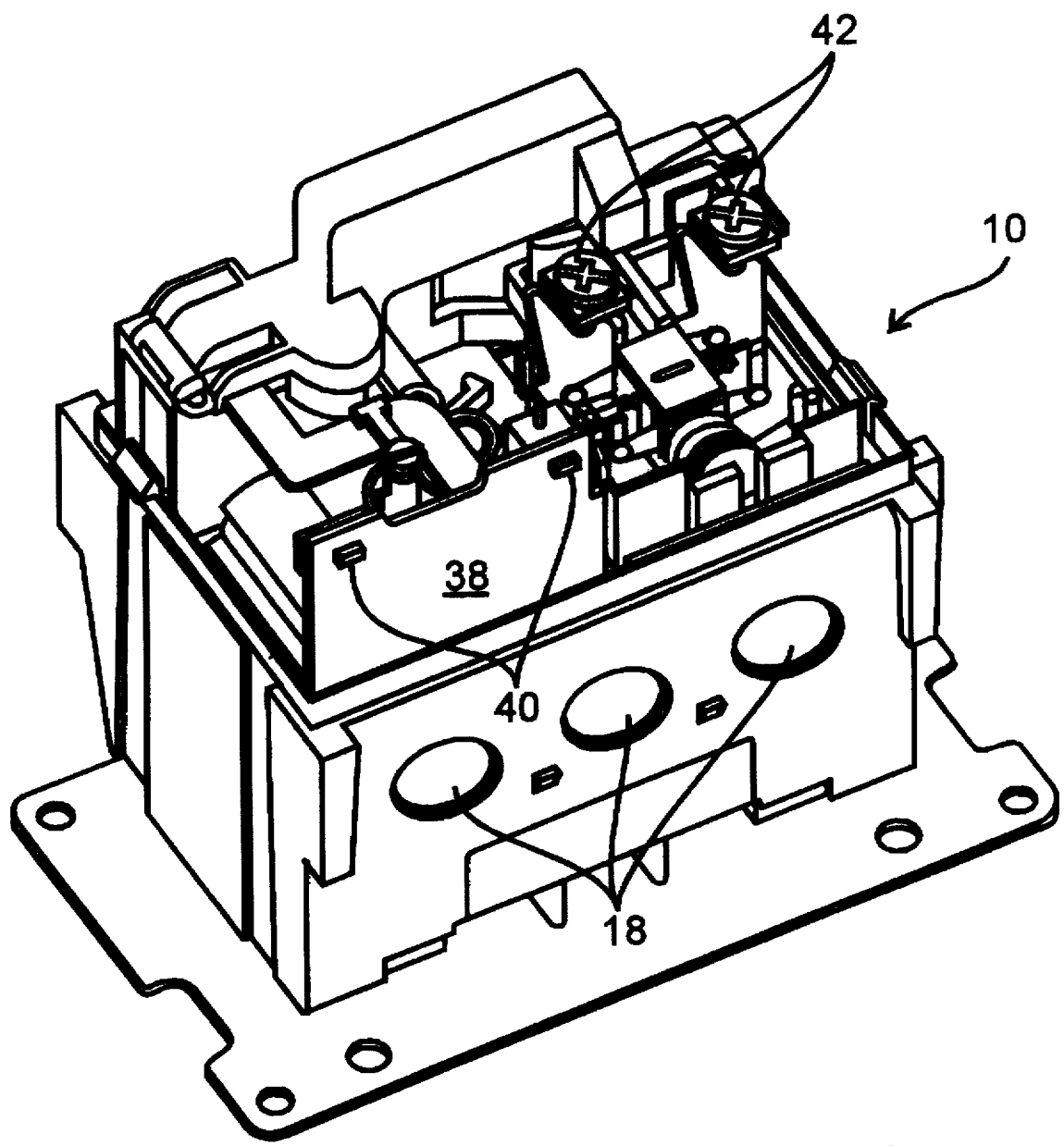
FIG. 2 is isometric view of the overload relay of FIG. 1 with the upper housing removed showing the internal electronics including a circuit board with a variable resistor attached.
Figure 4:
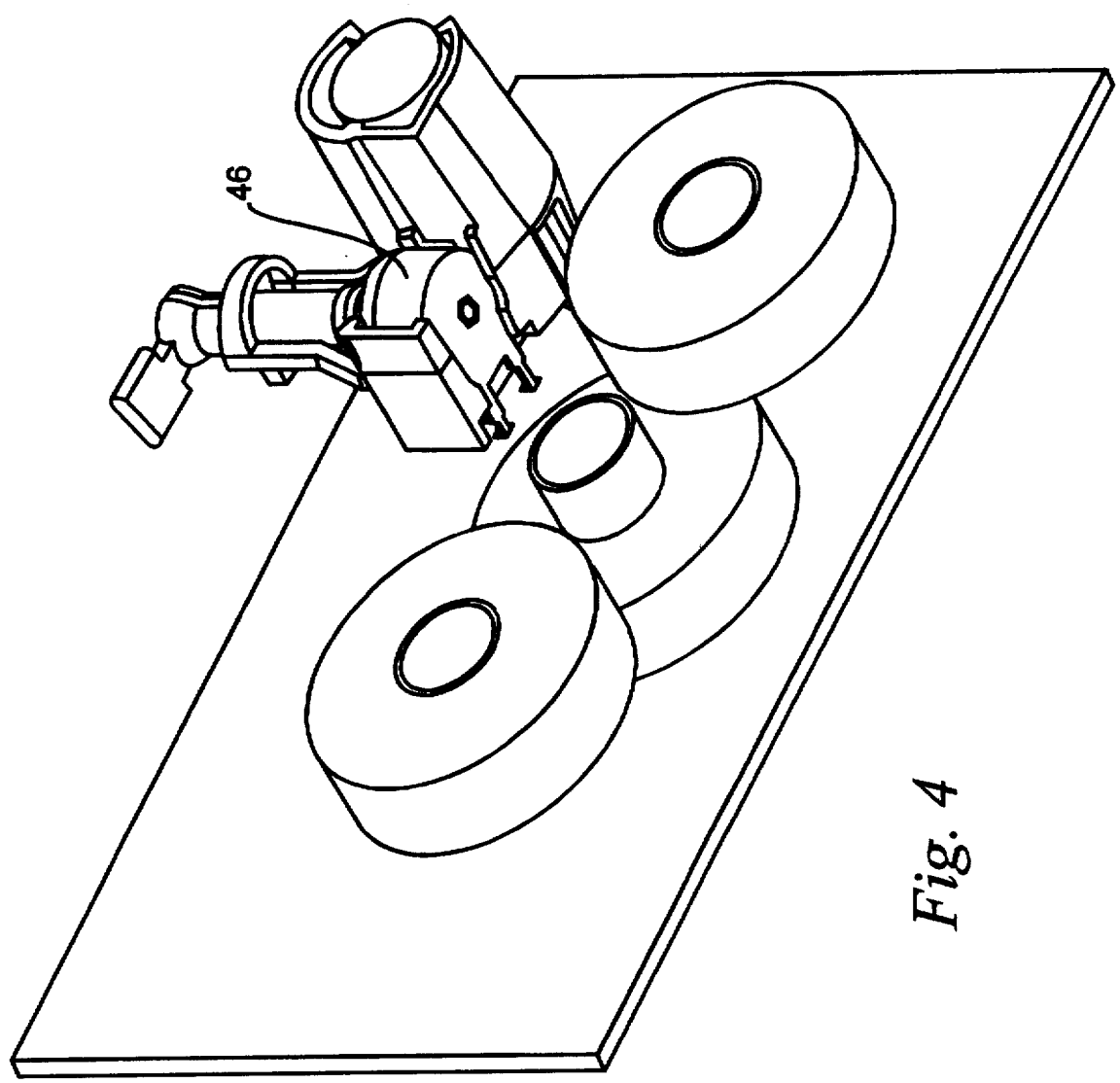
FIG. 4 is a view of the printed circuit board showing the variable resistor.

Referring now to FIG. 2, the upper portion of the housing 14 has been removed such that internal components of the overload relay 10 may be seen. Within the housing 14 are a number of current transformers 34 (see FIG. 4), each fixedly positioned about one of the passages 18 and being electrically and mechanically attached to a printed circuit board 38 which is fixedly positioned within the housing 14. One current transformer 34 is provided for each electrical phase of the primary circuit. As shown in FIG. 1, one of the conductors 22 passes through each of the passages 18 and thus through its associated current transformer 34 such that a current proportional to the primary current flowing in each conductor 22 is induced into the associated current transformer 34. Also located on the printed circuit board 38 are the electronic circuits of the overload relay 10 including a power supply circuit, a trip lock-out circuit, an overload detection circuit, a trip initiation circuit and a pair of test pads 40 electrically connected to the overload detection circuit. The test pads are easily accessible through hinge opening 41 (see FIG. 1) provided in the enclosure 14 for attaching a transparent cover to the overload relay 10 after the calibration has been completed. The power supply circuit uses a portion of the induced current from the current transformers 34 to power the overload relay 10 and to operate a solenoid in response to a signal from the trip initiation circuit. A contactor is connected electrically in series with the primary circuit conductors 22 such that the primary circuit can be opened by the contactor upon receiving a trip signal from the overload relay 10. A contactor control coil is connected to a pair of output terminals 42 for receiving the trip signal from the overload relay 10. The output terminals 42 are electrically connected to an output contact which is operated by the solenoid in response to a trip signal from the overload detection circuit. The trip lock-out circuit ensures that sufficient power is available in the power supply to complete the activation of the solenoid and thereby operate the contact thus sending the trip signal to the contactor control coil. The overload detection circuit uses a portion of the induced current from the current transformers 34 to determine when an overload condition has occurred in the primary circuit. The trip initiation circuit initiates a trip signal to the contactor in response to a detected overload in the primary circuit by the overload detection circuit. A variable resistor 46 located in the overload detection circuit and fixedly attached to the printed circuit board 38, as shown in FIG. 4, is used to adjust the detection circuit characteristics such that a desired trip point within the manufacturers preselected overload current range can be selected by the user. The desired trip point of the overload relay 10 is selected by moving the trip point indicator 26 with respect to the indicia 30 located adjacent to the trip point indicator 26. The trip point indicator 26 is attached to the variable resistor 46 such that a relative position between the trip point indicator 26 and the variable resistor 46 is maintained. Since the user can select the desired tripping point of the overload relay 10, the means by which he selects the tripping point must be accurate to a low percent of error. Therefore, the relationship between the trip point indicator 26 and the adjacent indicia 30 must accurately indicate the characteristics of the overload detection circuit such that it will accurately detect and indicate an overload condition in the primary circuit at the desired trip point. This is accomplished in the present invention by calibrating the indicia 30 with respect to positions of the trip point indicator 26 such that the overload detection circuit will indicate an overload condition in the primary circuit when the current flowing in the primary circuit is some preset percentage of the value indicated by the indicia 30 at which the trip point indicator 26 is pointing. This value may be set by standards to which the overload relay is manufactured.

Figure 3:
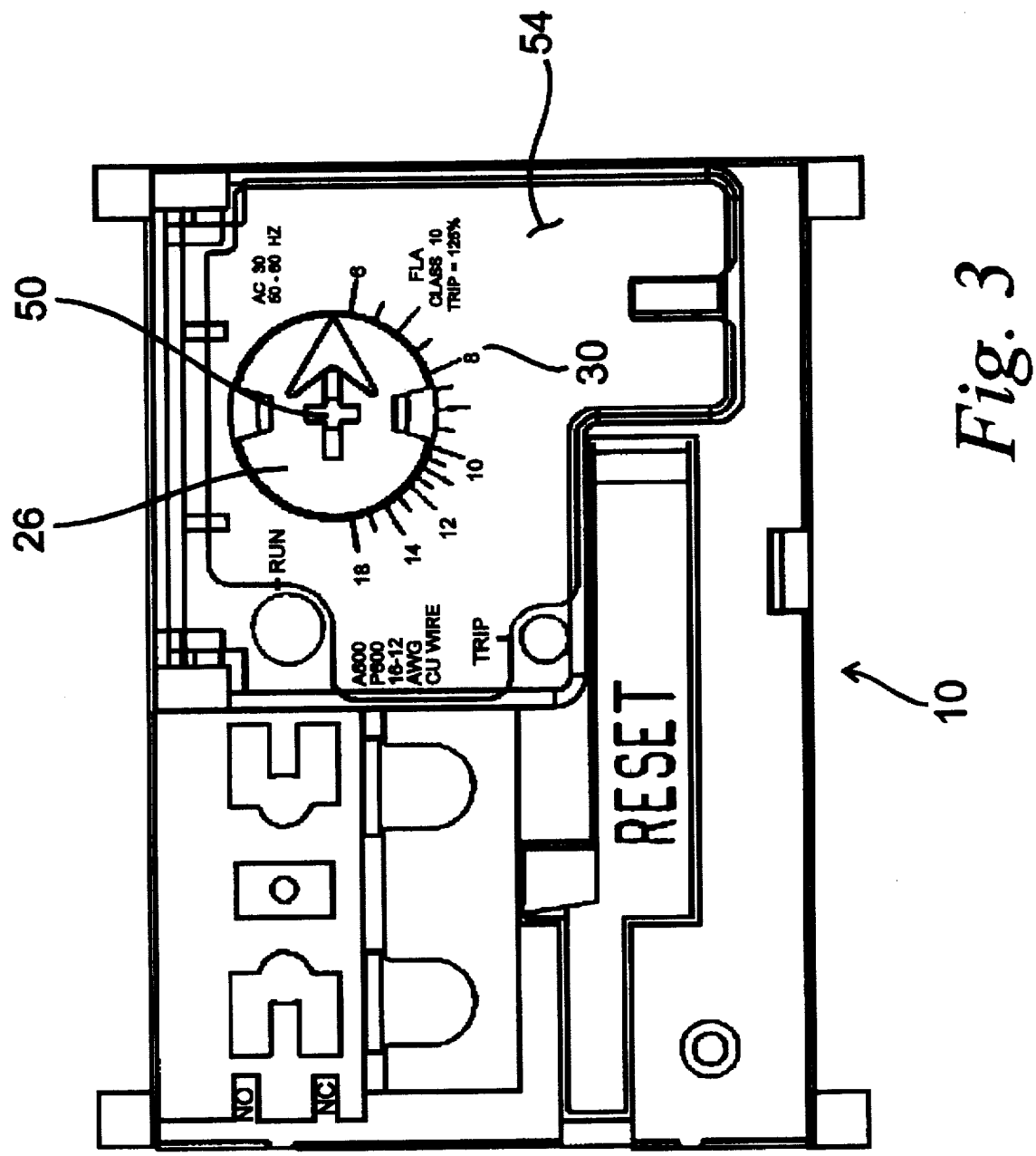
FIG. 3 is a top view of the overload relay of FIG. 1 illustrating the calibrated indicia adjacent the trip point indicator.

Referring now to FIG. 3, a better view of the trip point indicator 26 with respect to the indicia 30 is shown. The trip point indicator 26 includes an indexing groove 50 for interfacing with a computer controlled trip point indicator operator such as a robotic arm or other device capable of precisely manipulating the trip point indicator 26. The indicia 30 can be applied directly to the overload relay housing 14 or to a preinstalled permanently attached marking surface such as a label indicated by reference numeral 54.

Figure 5:
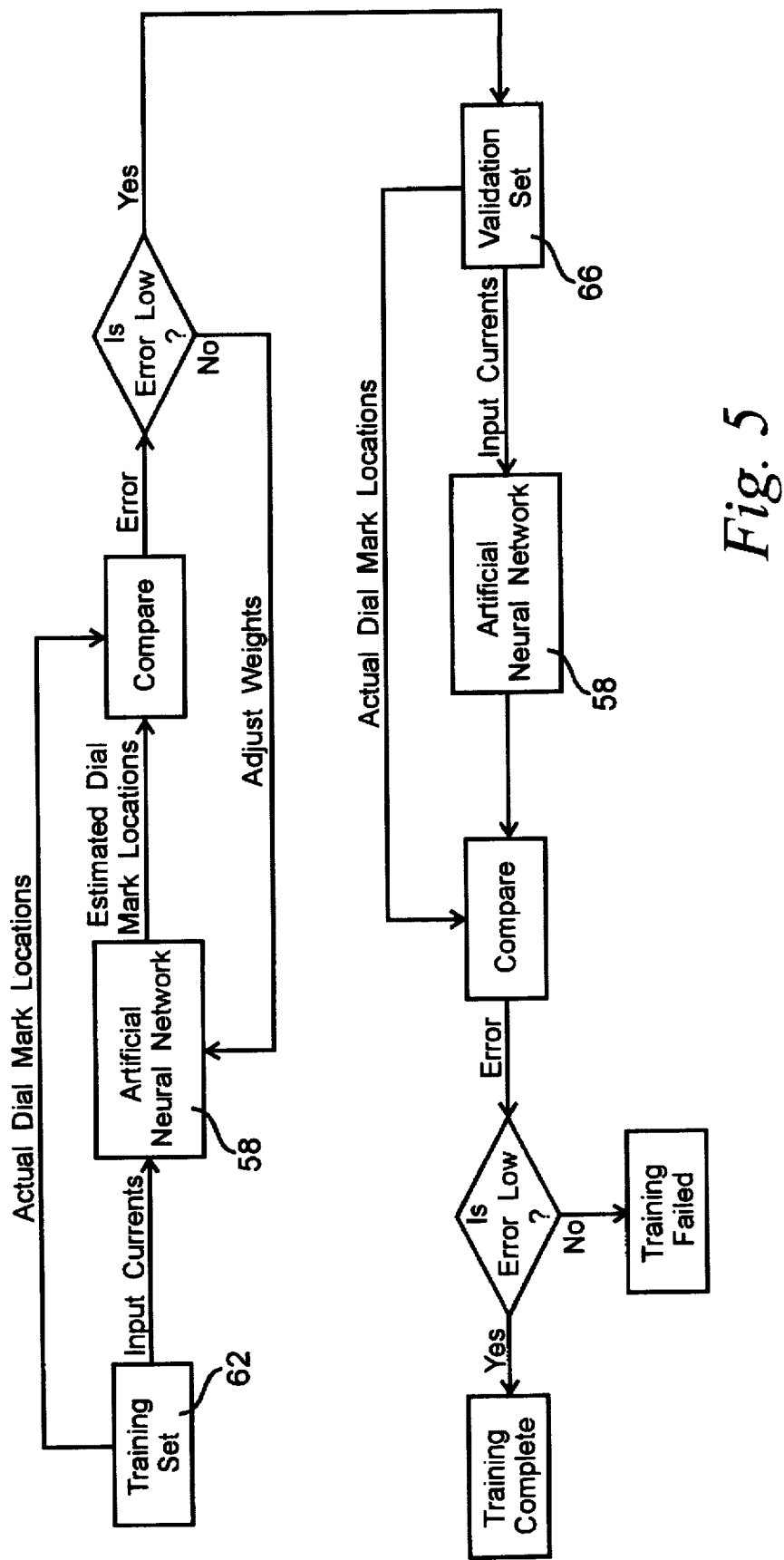
FIG. 5 is a flow chart of the first and second steps of the neural network training process for calibrating the indicia of an overload relay.

FIG. 5 is a flow chart illustrating the process of training a neural network 58 which will ultimately produce an output for a marking device such as a laser marker or printer that in turn applies the indicia 30 onto the selected surface at precisely determined positions with respect to the trip point indicator 26. The first stage of the neural network training process begins by selecting a statistically significant number of overload relays 10 for a training set 62. An overload relay 10 of the training set 62 is placed into a calibration fixture which holds the relay 10 firmly in position with respect to the computer controlled trip point indicator operator and the marking device. The trip point indicator operator is provided with means for engaging the trip point indicator indexing groove 50 such that it may selectively and precisely manipulate the trip point indicator 26 as instructed by the computer. The calibration fixture also includes a plurality of conductor means, one of which passes through each of the passages 18 of the overload relay 10. The conductor means are connected to a variable electric power source controlled by the computer. The computer can select particular current values or vary the current value applied to the conductor means, thereby simulating primary circuit currents of particular selected values and variable values. The calibration fixture also includes data collection pins which connect the test pads 40 of the overload relay to the computer such that the output signals of the overload detection circuit can be monitored and recorded by the computer. The training process involves moving the trip point indicator 26 of the overload relay 10 to a small number of particular positions, each precisely located with respect to a known reference point. At each of the particular positions of the trip point indicator 26 the current in the conductor means is varied by the computer until a desired output from the overload detection circuit is obtained. The number of particular positions is small with respect to the number of indicia marks to be estimated by the neural network 58. At each of these particular positions the computer records the value of the current applied to the conductor means. These current measurements are repeated for each overload relay 10 in the training set 62. These current values are the training input values for the neural network 58. The computer also applies current to the conductor means in values equal to the primary circuit overload current at each of the preselected trip point to be indicated by the indicia 30. The computer monitors the output of the overload detection circuit as the trip point indicator 26 is displaced from the known reference point by the trip point indicator operator. When the overload detection circuit produces the desired output, a voltage level corresponding to the threshold current passing through the conductor means, the precise position of the trip point indicator 26 with respect to the known reference point is recorded by the computer. This operation is repeated for each of the preselected overload trip points to be indicated by the indicia 30. After data has been recorded for each overload relay 10 in the training set 62, the neural network training input values for each overload relay 10 of the training set 62 are sent to the neural network 58. Based on these values the neural network 58 estimates the precise position of the trip point indicator 26 with respect to the known reference point for each of the preselected overload trip points to be indicated by the indicia 30. The estimated trip point indicator 26 positions are then compared with the previously recorded measured trip point indicator positions to determine the sum of the squared errors in the neural network estimated positions. If the sum of the squared of errors is above a predetermined value for percent of error in the training set 62, the weights applied by the neural network in estimating the trip point indicator positions are readjusted by a conventional method, such as the steepest descent method. The trip point indicator positions are then reestimated and again compared with the previously recorded trip point indicator positions. This readjustment process is repeated until the percent of error is less than the predetermined value for the training set 62. When the percent of error is below the predetermined value this portion of training the neural network 58 is over.

In the second stage of training the neural network 56, a second set of overload relays 10, the validation set 66, is selected and processed in the same basic manner as the training set 62. Two exceptions being that no adjustment are made to the weighting applied by the neural network 58 and the predetermined value for the percent of error is slightly higher than that used in the training set 62. If the estimated trip point indicator positions of the validation set 66 are not below a predetermined error value for the validation set 66 reasons for the high error should be investigated. One cause could be that one or more members of the validation set 66 have neural network input values significantly out of range with the training set 62 and/or other members of the validation set 66. These out of range overload relays 10 should be removed from the validation set 66. The number of hidden nodes in the neural network or the number of neural network training input values can be increased. When the percent of error of the validation set 66 is below or equal to the preselected value for the validation set the neural network calibration system is ready for use.

Figure 6A:
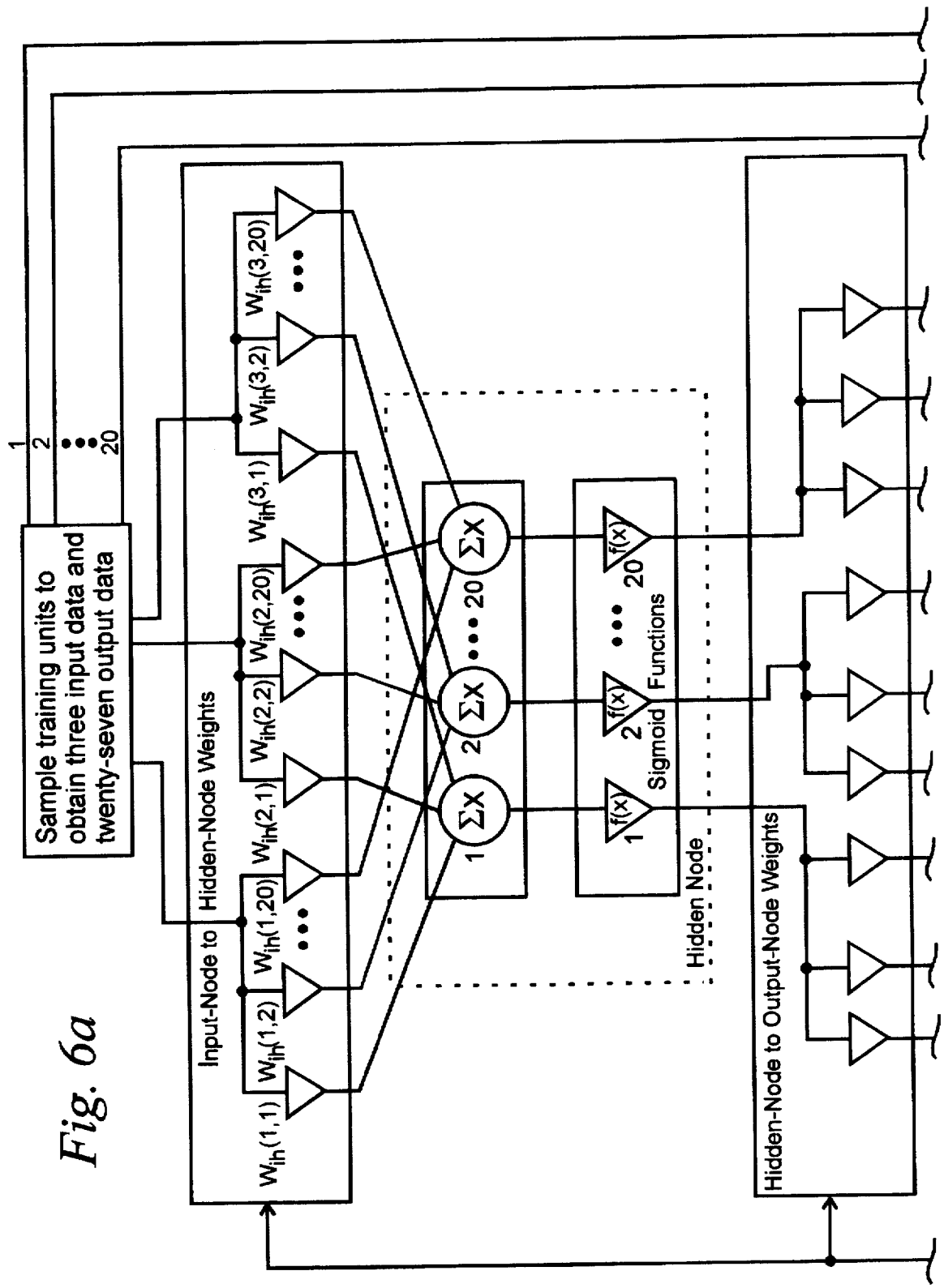
FIGS. 6A and 6B together illustrates in more detail the first step of the neural network training process.
Figure 6B:
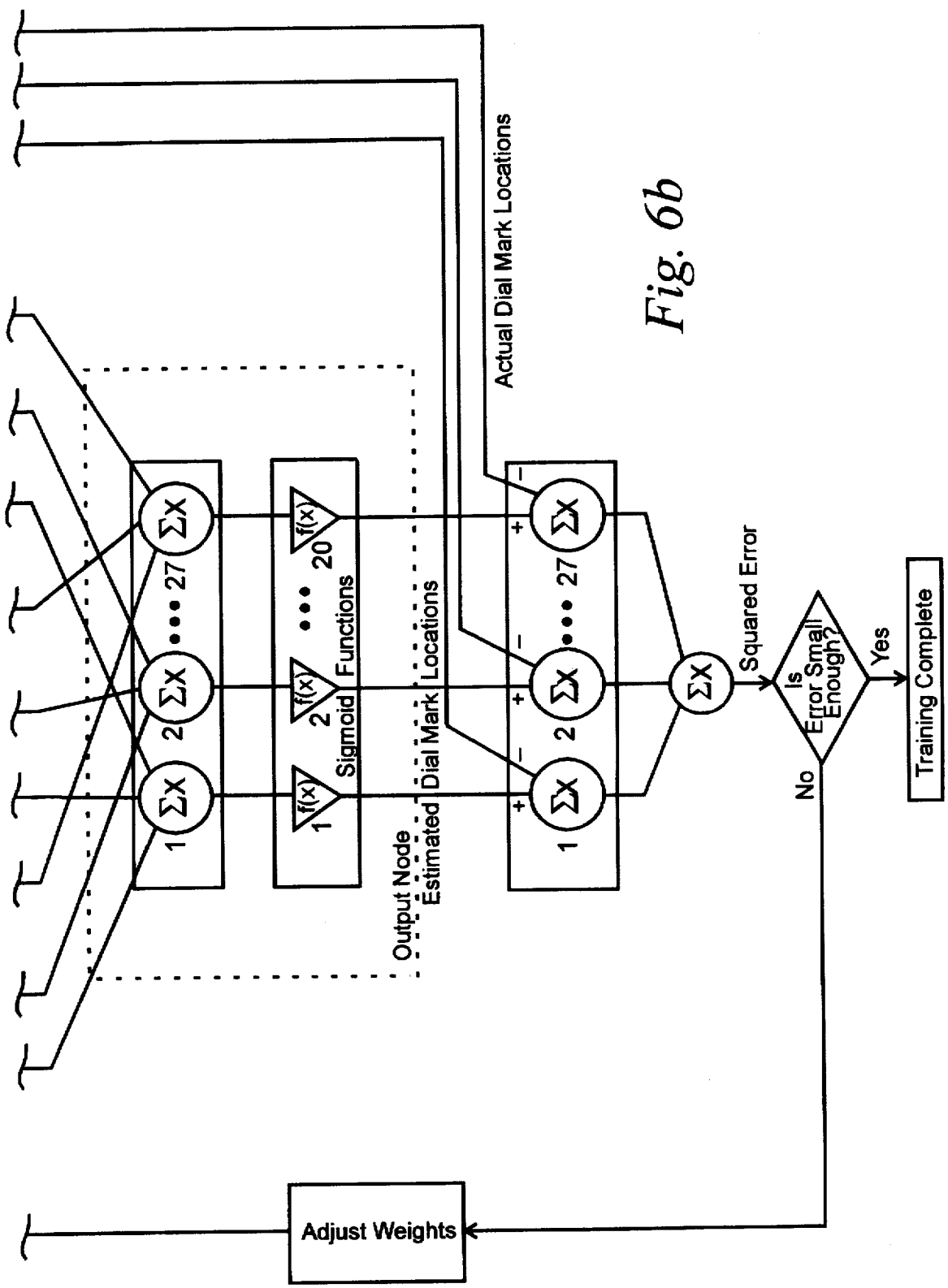

FIG. 6 illustrates in greater detail the first stage of the neural network training process. The second stage is the same except for adjusting the weighting as indicated above.

The actual calibration process for an overload relay 10 begins by properly securing the fully assembled relay 10 in the calibration fixture, checking to see that the trip point indicator operator is properly aligned with the indexing groove 50, checking to see that a conductor means is installed in each passage 18 and properly connected to the variable power source and checking to see that the data connection pins are connected to the overload relay test pads 40. The marking device should also be properly located above the selected surface of label 54. At this point the computer controlled calibration program is started. The trip point indicator operator will move the trip point indicator 26 to one of the previously determined particular positions, vary the current in the conductor means until the desired output is obtained from the overload detection circuit and then record the value of the current applied to the conductor means. This is repeated for the other particular positions of the trip point indicator 26 until the currents at all particular positions have been recorded. These current reading are the inputs which the neural network 58 will use for estimating the positions for each mark of the calibrated indicia 30. The output from the neural network 58 is sent to the marking device which precisely places the indicia 30 on the preferred surface of label 54. The overload relay 10 has then been calibrated such that the position of the trip point indicator 26 will accurately indicate the primary current or a manufactures preselected percentage of primary current value at which the overload detection circuit will send a trip signal to an associated contactor for interrupting the primary current.

In the preferred embodiment, three preselected positions of the trip point indicator 26 are used for the neural network training input values and twenty seven output positions for the indicia 30 are estimated by the neural network. The neural network of the preferred embodiment has one hidden layer with 20 nodes. Thus the neural network of the preferred embodiment is a three input one-hidden layer multiple-output artificial neural network.

I claim:

1. A method of calibrating the selectable trip points of an overload relay, said method comprising:

a) training a neural network;

b) validating the accuracy of the trained neural network;

c) placing an overload relay into a calibration fixture having a variable power supply, a plurality of conductors each electrically connected to said variable power supply, a rotating means, a data collection means and a marking means;

d) placing one of said plurality of conductors through an opening in said overload relay associated with a current transformer of said overload relay;

e) attaching said data collection means to a test output pad of said overload relay such that an electrical output signal can be detected from an overload detection circuit of said overload relay;

f) engaging said rotating means with a trip point indicator of said overload relay and rotating said trip point indicator to a first one of a small number of preselected positions, each precisely located with respect to a known reference point;

g) passing a current having a varying value through said conductor until a desired output signal from an overload detection circuit of said overload relay is detected by said data collection means;

h) Recording the particular current value of the variable current at the instant said desired output signal is detected;

i) repeating steps f through h until said particular current values from all of said small number of preselected positions have been recorded;

j) sending said recorded particular current values to said neural network for processing;

k) outputting a signal from said neural network to said marking means for marking a calibrated indicia immediately adjacent said trip point indicator of said overload relay such that said trip point indicator accurately indicates the selectable tripping points of said overload relay.

* * * * *